United States Patent
Hikavyy et al.

(10) Patent No.: US 9,263,263 B2
(45) Date of Patent: Feb. 16, 2016

(54) METHOD FOR SELECTIVE GROWTH OF HIGHLY DOPED GROUP IV—SN SEMICONDUCTOR MATERIALS

(71) Applicant: IMEC, Leuven (BE)

(72) Inventors: Andriy Hikavyy, Leuven (BE); Benjamin Vincent, Leuven (BE); Roger Loo, Leuven (BE)

(73) Assignee: IMEC, Leuven (BE)

( * ) Notice: Subject to any disclaimer, the term of this patent is extended or adjusted under 35 U.S.C. 154(b) by 1 day.

(21) Appl. No.: 13/944,592

(22) Filed: Jul. 17, 2013

(65) Prior Publication Data
US 2014/0024204 A1   Jan. 23, 2014

(30) Foreign Application Priority Data
Jul. 17, 2012 (EP) .................. 12176741

(51) Int. Cl.
*H01L 21/02* (2006.01)
*H01L 21/205* (2006.01)

(52) U.S. Cl.
CPC ...... *H01L 21/02636* (2013.01); *H01L 21/0262* (2013.01); *H01L 21/02532* (2013.01); *H01L 21/02535* (2013.01); *H01L 21/02579* (2013.01); *H01L 21/2053* (2013.01)

(58) Field of Classification Search
CPC .......... H01L 21/02365; H01L 21/02518; H01L 21/02584; H01L 21/2018; H01L 21/205; H01L 21/2053; H01L 21/02535
See application file for complete search history.

(56) References Cited

U.S. PATENT DOCUMENTS

2009/0087967 A1   4/2009   Todd
2010/0077335 A1   3/2012   Sanchez et al.

OTHER PUBLICATIONS

Vincent, B. et al., "Characterization of GeSn Materials for Future Ge pMOSFETs Source/Drain Stressors", Microelectronic Engineering, vol. 88, 2011, pp. 342-346.
European Search Report, European Patent Application Serial No. EP 12176741 (Dec. 3, 2012).
Vincent et al., "Undoped and in-situ B doped GeSn epitaxial growth on Ge by atmospheric pressure-chemical vapor deposition," Applied Physics Letters vol. 99, Issue 15 ( Oct. 2011).
Soref et al., "Advances in SiGeSn technology," J. Mater, Res., vol. 22, No. 12 (Dec. 2007).

*Primary Examiner* — Cheung Lee
(74) *Attorney, Agent, or Firm* — McDonnell Boehnen Hulbert & Berghoff LLP

(57) ABSTRACT

Disclosed are methods for selective deposition of doped Group IV-Sn materials. In some embodiments, the method includes providing a patterned substrate comprising at least a first region and a second region, where the first region includes an exposed first semiconductor material and the second region includes an exposed insulator material, and performing at least two cycles of a grow-etch cyclic process. Each cycle includes depositing a doped Group IV-Tin (Sn) layer, where depositing the doped Group IV-Sn layer includes providing a Group IV precursor, a Sn precursor, and a dopant precursor, and using an etch gas to etch back the deposited doped Group IV-Sn layer.

20 Claims, 1 Drawing Sheet

METHOD FOR SELECTIVE GROWTH OF HIGHLY DOPED GROUP IV—SN SEMICONDUCTOR MATERIALS

CROSS-REFERENCE TO RELATED APPLICATION

This application claims priority to European Patent Application Serial No. EP 12176741.2 filed Jul. 17, 2012, the contents of which are hereby incorporated by reference.

BACKGROUND

In some applications, it may be desirable to selectively provide a highly doped Group IV-Sn semiconductor material, such as, for example, SiSn, SiGeSn or GeSn, on semiconductor surfaces without providing the same on insulating surfaces. For example, complementary metal-oxide-semiconductor (CMOS) transistors may be fabricated using methods that provide mono-crystalline semiconductor films only on the active areas of the transistors (e.g., source/drain structures). Other examples are possible as well.

Typically, the dopants in the group IV-Sn semiconductor material are provided by means of implantation of the dopants in this material. For example, Boron implantation in GeSn is described by B. Vincent et al. in "Characterization of GeSn materials for future Ge pMOSFETs source/drain stressors," Microelectronic Engineering 88 (2011) 342-346. This approach, however, is difficult for shallow junctions. Moreover, after implantation, an anneal step is required to activate the dopants. For GeSn, the thermal budget of this anneal step is limited to temperatures below 600° C. in order to avoid Sn precipitation. This low temperature thermal budget then limits the Boron activation.

SUMMARY

Disclosed are methods for the selective deposition of doped Group IV-Sn semiconductor materials. In some embodiments, the methods may be directed to the deposition of highly doped Group IV-Sn semiconductor materials. The (highly) doped Group IV-Sn semiconductor materials deposited using the disclosed methods may be used at low processing temperatures, e.g., below 650° C., below 550° C., or below 500° C., below 400° C., or even below 350° C.

Disclosed are methods for providing selective deposition of a doped Group IV-Sn material on a first semiconductor material. The method includes providing a patterned substrate comprising at least a first region and a second region, where the first region comprises an exposed first semiconductor material and the second region comprises an exposed insulator material. The method further includes depositing the doped Group IV-Sn layer by providing a precursor of the group IV semiconductor material, $SnCl_4$ acting at the same time as a Sn precursor and a selective growth regulator, a dopant precursor, and optionally, depending on the deposition process, a carrier gas. The method further includes thereafter etching back the deposited doped group IV-Sn layer using an etch gas until the layer is substantially completely removed from the second region, thereby compensating a loss in selectivity of the depositing step due to the interaction between the selective growth regulator and the dopant precursor. The depositing and etching steps may be repeated in a grow-etch cyclic process.

During deposition, monocrystalline doped group IV-Sn material may be grown on the first region and polycrystalline doped group IV-Sn material may be grown on the second region. During the etch step, the polycrystalline doped group IV-Sn material may be removed more quickly than the monocrystalline doped group IV-Sn material, thereby leaving some monocrystalline doped group IV-Sn material on the first region while removing substantially all the polycrystalline doped group IV-Sn material from the second region.

In some embodiments, providing the patterned substrate may include loading the patterned substrate into a chemical vapor deposition chamber.

In some embodiments, the doped Group IV-Sn layer may be deposited a temperature lower than 650° C., lower than 500° C., or even lower than 350° C. Thus, the disclosed methods allow for the deposition of doped Group IV-Sn layers at low processing temperatures.

In some embodiments, the doped Group IV-Sn layer may be a GeSn:B layer having a dopant concentration of, for example, at least about $1 \cdot 10^{18}$ at·cm$^{-3}$.

In some embodiments, the Group IV precursor may be a germanium precursor. Further, in some embodiments, the Group IV precursor may be $Ge_2H_6$ or a higher order germanes. In some embodiments, the Group IV precursor may be provided at a partial pressure higher than 10 mTorr.

In some embodiments, the dopant precursor may be $B_2H_6$. In these embodiments, a dopant concentration of at least about $1 \cdot 10^{18}$ at·cm-3 may be obtained.

In some embodiments, the doped Group IV-Sn layer may have a Sn concentration of at least about 5 at %.

In some embodiments, the insulator material may be selected from the group consisting of an oxide of a group IV element, a nitride of a group IV element, and any combination thereof.

In some embodiments, the first region may comprise silicon, germanium, or silicon germanium. Alternatively, in some embodiments the first region may comprise a binary or a tertiary III-V compound such as a III-V compound selected from a group consisting of III-antimonides, III-arsenides, III-phosphides, and any combination thereof.

Particular and preferred aspects of the disclosure are set out in the accompanying independent and dependent claims. Features from the dependent claims may be combined with features of the independent claims and with features of other dependent claims as appropriate and not merely as explicitly set out in the claims.

For purposes of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

The above and other aspects of the disclosure will be apparent from and elucidated with reference to the embodiment(s) described hereinafter.

BRIEF DESCRIPTION OF THE DRAWINGS

The disclosure will now be described further, by way of example, with reference to the accompanying drawings, in which.

Figure 1:
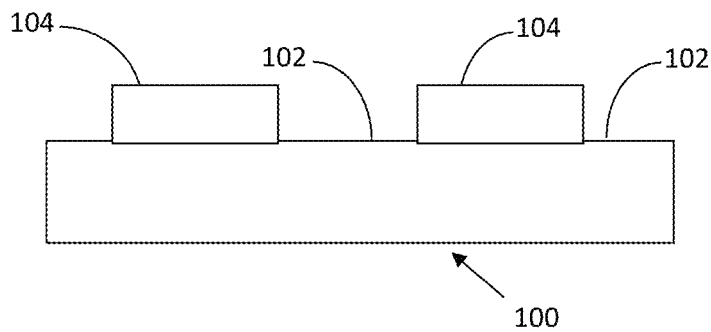
FIG. 1 illustrates an example patterned substrate comprising a first region and a second region, where the first region comprises an exposed semiconductor material, and the second region comprises an exposed insulator material, in accordance with some embodiments.

It will be understood that the drawings are merely illustrative and are non-limiting. In the drawings, the size of some of the elements may be exaggerated and not drawn on scale for illustrative purposes. The dimensions and the relative dimensions do not necessarily correspond to actual reductions to practice of the disclosure.

Any reference signs in the claims shall not be construed as limiting the scope.

In the different drawings, the same reference signs refer to the same or analogous elements.

DETAILED DESCRIPTION

The present disclosure will be described with respect to particular embodiments and with reference to certain drawings but the disclosure is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the context of the present disclosure, a precursor is a product, element or compound that participates in a chemical reaction that produces another product, element or compound, whereby at least part of the precursor after reaction forms part of the another product, element or compound. In particular in the context of the present disclosure, the referenced chemical reaction is a deposition reaction for depositing a semiconductor material film or layer.

In the context of the present disclosure, a single source precursor is a precursor where all the elements required into the other compound are provided in that single precursor.

In the context of the present disclosure, a carrier gas is a gas stream that brings a precursor of semiconductor material and tin-tetrachloride ($SnCl_4$) into the chemical vapor deposition (CVD) chamber. The carrier gas can be any inert gas (i.e., a gas that is non-reactive with other components in the CVD chamber). The inert gas may be elemental, such as, for example, in the case of noble gases, or may be a compound gas. In some embodiments, the inert gases may be specifically selected for the particular operational settings of the CVD chamber for which they are functionally inert. In other embodiments, no carrier gas may be used (e.g., an ultra-high vacuum chemical vapor deposition (UHVCVD) process does not require a carrier gas).

The tin-tetrachloride carrier gas may be added at the same time as a Sn precursor and as a source of etchant material (Cl) to regulate selective growth.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

It has been found that for Boron-doped GeSn growth, the selectivity of the growth is reduced or even partially lost irrespective the carrier flow used. The addition of $B_2H_6$ in the gas phase reaction forms $B_2Cl_6$ by-products with $SnCl_4$ and reduces selectivity. To regain selectivity, $Cl_x$ products may be added in the reaction. For example, by adding HCl and/or using higher $SnCl_4$ flows, the selectivity may be regained. Other examples are possible as well. However, such addition of HCl and/or use of higher $SnCl_4$ flows may result in a very limited Boron incorporation due mainly to the formation of $B_2Cl_6$ by-products. Thus, adding HCl and/or using higher SnCl$_4$ flows is not conducive to the selective deposition of doped Group IV-Sn material at certain dopant concentrations (e.g., with a dopant concentration of $1\times10^{19}$ at·cm$^{-3}$ or above), such as GeSn:B layers with high Boron concentrations (e.g., $2\times10^{20}$ at·cm$^{-3}$).

The disclosed methods begin with providing a substrate. The patterned substrate may, for example, be similar to the example patterned substrate 100 illustrated in FIG. 1. The patterned substrate 100 may be formed of a semiconductor material, such as, for example, silicon, germanium, silicon-germanium, III/V compound substrates, or another material compatible with the semiconductor manufacturing such as glass, quartz. The patterned substrate 100 may further take the form of a silicon-on-insulator (SOI) or germanium-on-insulator (GeOI) substrate. In some embodiments, the patterned substrate 100 may be a silicon wafer. Other patterned substrates are possible as well.

As shown, the patterned substrate 100 includes a first region 102 and a second region 104. The first region 102 may include an exposed first semiconductor material. The first semiconductor material may be the semiconductor material of the patterned substrate 100, as shown, or may be a layer of another semiconductor material grown epitaxially on the patterned substrate 100, such as, for example, silicon, germanium, silicon germanium, or a binary or a tertiary III-V compound (e.g., III-antimonides, III-arsenides, III-phosphides and any combination thereof). Other first semiconductor material are possible as well.

The second region 104 may include an exposed insulator material. The insulator material may be, for example, an oxide or a nitride of a Group IV element or any combination thereof. In some embodiments, the insulator material may further comprise a second Group IV element, such as Carbon (C). The insulator material may, for example, be silicon oxide, silicon nitride, or any combination thereof. Other insulator materials are possible as well.

The disclosed methods may further include loading the patterned substrate 100 into a CVD chamber. A doped Group IV-Sn material may then be selectively deposited on the exposed first semiconductor material in the first region 102. The group IV-Sn semiconductor material may comprise one or more Group IV elements. In some embodiments, the Group IV-Sn semiconductor material may be selected from the group consisting of Sn alloyed Si, Ge or SiGe and any combination thereof. Other Group IV-Sn semiconductor materials are possible as well. The deposition conditions of the group IV-Sn semiconductor material may be such that mono-crystalline material is deposited.

To this end, a cyclic deposition-etch process may be used. In such process, a non-selective deposition is alternated with an etch in the CVD chamber; hence the supplies of etchant gas and dopant elements are both interrupted and alternated.

Such a cyclic deposition-etch process may allow for the selective deposition of a doped Group IV-Sn material on the exposed first semiconductor material in the first region 102. The doped Group IV-Sn material may be, for example, SiGeSn:B or GeSn:B. Other Group IV-Sn materials are possible as well.

In some embodiments, the doped Group IV-Sn material may be a highly doped (e.g., may have a concentration of at least 5 at %). In embodiments where the doped Group IV-Sn material is SiGeSn:B or GeSn:B, the doped Group IV-Sn material may have a high concentration of both Sn and B. For example, the doped Group IV-Sn material may have a concentration of Sn of at least about 5 at %, and may have a concentration of B of about $1\cdot10^{18}$ at·cm$^{-3}$ or higher, of about $1\cdot10^{19}$ at·cm$^{-3}$ or higher, or even of about $2\cdot10^{20}$ at·cm$^{-3}$ or higher.

During the deposition step, a monocrystalline doped Group IV-Sn material (e.g., monocrystalline GeSn:B) may be grown in the first region 102, while a polycrystalline doped Group IV-Sn material (e.g., polycrystalline GeSn:B) may be deposited in the second region 104. Hereto a precursor of the Group IV semiconductor material may be provided, and SnCl4 may be provided as a Sn precursor. SnCl$_4$ is a stable precursor, suitable for low temperature deposition processes. The Group IV precursor may be, for example, a gas comprising the Group IV element. Further, the Group IV precursor may be, for example, a single-source precursor (e.g., Si$_x$H$_{2x+2}$, Ge$_x$H$_{2x+2}$, SiCl$_x$H$_{4-x}$, SiH$_3$—CH$_3$, or combined Si$_x$Ge$_y$H$_{2(x+y)+2}$ precursors) or a mixture of two or more precursors (e.g., Si$_x$H$_{2x+2}$ or Ge$_x$H$_{2x+2}$). In some embodiments, the SnCl$_4$ may be provided to the deposition chamber diluted in a carrier gas, such as N$_2$ or H$_2$ or an inert gas.

Further, a dopant precursor may be provided, and optionally, depending on the deposition process, a carrier gas may be provided. By adding a dopant precursor, the Group IV-Sn semiconductor material may further comprise n-type (e.g., P, As) or p-type (e.g., B) dopants. The carrier gas may be, for example, N$_2$, H$_2$ or a noble gas (He, Ar). For example, because a UHVCVD process runs without a carrier gas, in embodiments where UHVCVD is used, no carrier gas may be provided. For example, in embodiments where GeSn:B is to be grown, Ge$_2$H$_6$ may be provided as the Group IV semiconductor material precursor, SnCl$_4$ may be provided as the Sn precursor, B$_2$H$_6$ may be provided as the dopant precursor, and H$_2$ or N$_2$ may be provided as the carrier gas. Other examples are possible as well.

Thereafter, during the etching step, the polycrystalline doped Group IV-Sn material (e.g., polycrystalline GeSn:B) may be removed by the etch step more quickly (e.g., at a higher etch rate) than the monocrystalline doped Group IV-Sn material (e.g., monocrystalline GeSn:B). Hereto, an etchant gas such as HCl or Cl$_2$ may be provided in the CVD chamber. During the etching step, the deposited doped Group IV-Sn layer may be etched back using an etch gas until the layer is substantially completely removed from the second region 104 comprising the exposed insulator material, thereby compensating a loss in selectivity of the depositing step due to the interaction between the selective growth regulator and the dopant precursor, as described above.

The cycle of deposition and etching is repeated until a desired, predetermined doped Group IV-Sn (e.g., polycrystalline GeSn:B) material thickness is obtained.

In particular embodiments, the same temperature and pressure may be kept for both the growth and etch steps.

In some embodiments, it may be desirable to provide the dopant precursor and the etchant gas serially, rather than simultaneously, in the CVD chamber. For example, in embodiments where GeSn:B is to be selectively grown, providing B$_2$H$_6$ and HCl or Cl$_2$ simultaneously in the CVD chamber may result in the generation of B$_2$Cl$_6$ byproducts, which severely reduce the dopant incorporation in the semiconductor material formed. Hence, with such simultaneous provision high dopant concentrations (e.g., $1\cdot10^{18}$ at·cm$^{-3}$ or higher, or $1\cdot10^{19}$ at·cm$^{-3}$ or higher, or even $2\times10^{20}$ at·cm$^{-3}$) could not be obtained. This may be addressed by carrying out a cyclic process, as described above, in which steps where dopants are present in the CVD chamber alternate with steps where etchant gas is present in the CVD chamber.

Figure 2:
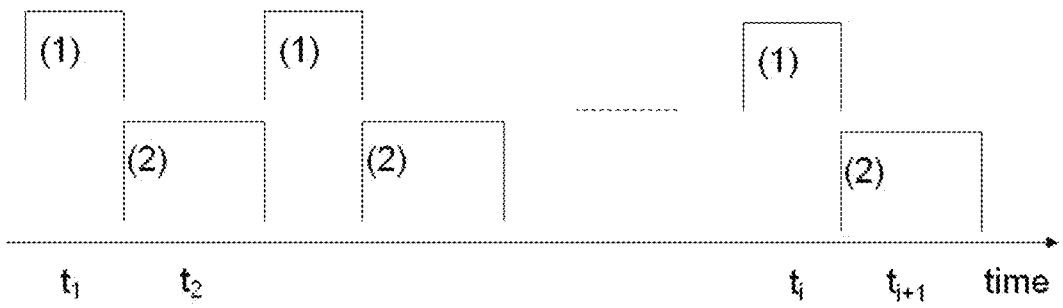
FIG. 2 is a schematic representation of the growth-etch cyclic process, in accordance with some embodiments.
Figure 3:
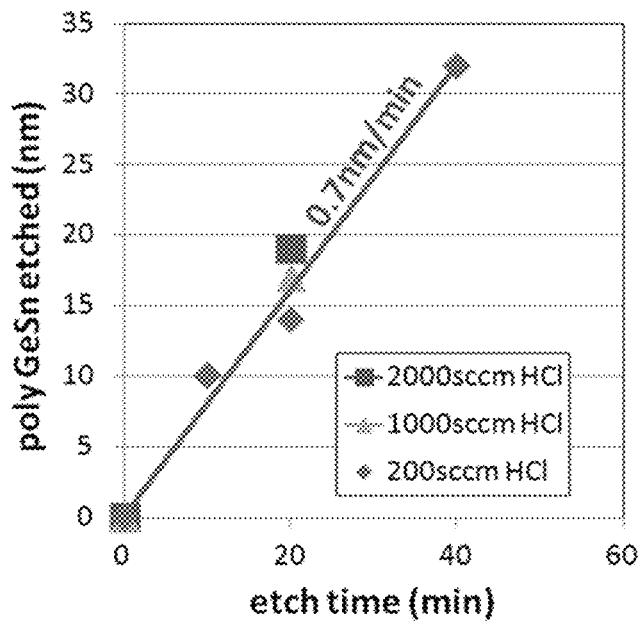
FIG. 3 illustrates polycrystalline GeSn etched thickness as function of etch time at 320° C. and atmospheric pressure, for different rates of etchant gas flow (HCl).

FIG. 2 shows a schematic representation of the growth-etch cyclic process, in accordance with some embodiments. This process includes growth steps indicated (1), in which growth of the Group IV-Sn material takes place by supplying a Group IV semiconductor precursor (e.g. $Ge_2H_6$), a Sn precursor (e.g., $SnCl_4$), a dopant precursor (e.g., $B_2H_6$), and a carrier gas (e.g., $H_2$ or $N_2$); and etch steps indicated (2), in which an etchant gas (e.g., HCl or $Cl_2$ or any other etch gas known in the art) is supplied in the CVD chamber. In the context of the present disclosure, $SnCl_4$ is not used as an etch gas but as an Sn precursor. In some embodiments, such as that shown, the etch rate may be much lower than the growth rate, with the result that the etch steps may be substantially longer than the growth steps. For example, in embodiments where HCl is used as etchant, the etch rate may be about 0.7 nl/min (as shown in FIG. 3 and described below), which is about 10 times lower than the growth rate. As a result, the etch time (e.g., $t_2, t_4, t_6, \ldots, t_{i+1}$) will be about ten times longer than the growth time (e.g., $t_1, t_3, t_5, \ldots, t_i$). For example, the etch time may be approximately 10 minutes, while the growth time may be approximately 1 minute. Other examples are possible as well. In other embodiments, not illustrated, such as those where $Cl_2$ is used as etchant, the etch rate may be higher.

FIG. 3 illustrates the etch rate of polycrystalline GeSn etched at 320° C. at an atmospheric pressure for 200, 1000, and 2000 sscm of HCl. However, specific values of growth time and etch time depend on the overall pressure in the reactor, the partial pressures of the different precursors, the precursor choice and the process temperature.

The disclosed methods allow for the selective deposition of Group IV-Sn material at a temperature lower than 650° C., or even lower than 400° C. Thus, the disclosed methods may be used for low temperature selective deposition.

Deposition of the Group IV-Sn semiconductor material may be suitably conducted according to any of the various CVD methods known to those skilled in the art, including, but not limited to, e.g., atmospheric pressure CVD (APCVD), low pressure CVD (LPCVD), and ultra high vacuum CVD (UHVCVD). While typical CVD deposition temperatures range from about 200° C. to about 800° C., in some embodiments the disclosed methods may allow for deposition at temperatures below 650° C., below 500° C., or even below 350° C.

In some embodiments, the Group IV semiconductor material to be selectively deposited may be GeSn. In these embodiments, the patterned substrate may include first regions of germanium and second regions of silicon oxide. The Group IV precursor may be a germanium precursor, such as, for example, germane, digermane, trigermane and higher order germanes, such as neo-pentagermane.

In these embodiments, digermane can be used at temperatures below 500° C. in combination with $SnCl_4$ and the growth-etch cyclic process described above to provide selective deposition of GeSn. Both precursors are widely available and do not impose safety constraints at this manufacturing step. This represents a clear advantage of the method in contrast with solutions known to present serious safety risks.

Therefore, the disclosed methods may be suitable for epitaxially growing GeSn for different applications, such as, for example, elevated source/drain applications. Other Group IV semiconductor materials and other applications are possible as well.

While the disclosure has been illustrated and described in detail in the drawings and foregoing description, such illustration and description are to be considered illustrative or exemplary and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

The invention claimed is:

1. A method comprising:
   providing a patterned substrate comprising at least a first region and a second region, wherein the first region comprises an exposed first semiconductor material and the second region comprises an exposed insulator material; and
   performing at least two cycles of a grow-etch cyclic process, wherein each cycle comprises:
   (i) depositing a doped Group IV-Tin (Sn) layer, wherein a Sn concentration throughout the doped Group IV-Sn layer is at least about 5 at %, wherein depositing the doped Group IV-Sn layer comprises providing a Group IV precursor, a Sn precursor, and a dopant precursor, and
   (ii) using an etch gas to etch back the deposited doped Group IV-Sn layer.

2. The method of claim 1, wherein providing the patterned substrate comprises loading the patterned substrate into a chemical vapor deposition chamber.

3. The method of claim 1, wherein the first semiconductor material comprises at least one of silicon, germanium, or silicon germanium.

4. The method of claim 1, wherein the first semiconductor material comprises at least one of a binary or a tertiary III-V compound.

5. The method of claim 1, wherein the first semiconductor material comprises a III-V compound selected from the group consisting of III-antimonides, III-arsenides, III-phosphides, and any combination thereof.

6. The method of claim 1, wherein:
   the patterned substrate comprises a substrate semiconductor material; and
   the first semiconductor material comprises the substrate semiconductor material.

7. The method of claim 1, wherein the insulator material is selected from the group consisting of an oxide of a Group IV element, a nitride of a Group IV element, and any combination thereof.

8. The method of claim 1, wherein performing at least two cycles of the grow-etch cyclic process comprises performing the grow-etch cyclic process until the doped Group IV-Sn layer is substantially completely removed from the second region.

9. The method of claim 1, wherein depositing the doped Group IV-Sn layer comprises:
   depositing monocrystalline doped Group IV-Sn material on the first region; and
   depositing polycrystalline doped Group IV-Sn material on the second region.

10. The method of claim 9, wherein using an etch gas to etch back the deposited doped Group IV-Sn layer comprises etching the polycrystalline doped Group IV-Sn material at a higher etching rate than the monocrystalline doped Group IV-Sn material.

11. The method of claim 1, wherein depositing the doped Group IV-Sn layer comprises depositing the doped Group IV-Sn layer at a temperature lower than about 650° C.

12. The method of claim 1, wherein depositing the doped Group IV-Sn layer comprises depositing the doped Group IV-Sn layer at a temperature lower than about 500° C.

13. The method of claim 1, wherein depositing the doped Group IV-Sn layer comprises depositing the doped Group IV-Sn layer at a temperature lower than about 350° C.

14. The method of claim 1, wherein the doped Group IV-Sn layer has a Boron concentration of at least about $1 \cdot 10^{18}$ at·cm$^{-3}$.

15. A method comprising:
   providing a patterned substrate comprising at least a first region and a second region, wherein the first region comprises an exposed first semiconductor material and the second region comprises an exposed insulator material; and
   performing at least two cycles of a grow-etch cyclic process, wherein each cycle comprises:
   (i) depositing a doped Group IV-Tin (Sn) layer comprising at least one of GeSn:B or SiGeSn:B, wherein the doped Group IV-Sn layer has a Boron concentration of at least about $1 \cdot 10^{18}$ at·cm$^{-3}$, wherein depositing the doped Group IV-Sn layer comprises providing a germanium precursor, a Sn precursor, and a dopant precursor, and
   (ii) using an etch gas to etch back the deposited doped Group IV-Sn layer.

16. The method of claim 15, wherein the germanium precursor is selected from the group consisting of digermane, trigermane, tetragermane, pentagermane, and neo-pentagermane.

17. The method of claim 15, wherein the dopant precursor comprises $B_2H_6$.

18. The method of claim 15, wherein the doped Group IV-Sn layer has a Sn concentration of at least about 5 at %.

19. The method of claim 15, wherein depositing the doped Group IV-Sn layer comprises:
   depositing monocrystalline doped Group IV-Sn material on the first region; and
   depositing polycrystalline doped Group IV-Sn material on the second region.

20. The method of claim 19, wherein using an etch gas to etch back the deposited doped Group IV-Sn layer comprises etching the polycrystalline doped Group IV-Sn material at a higher etching rate than the monocrystalline doped Group IV-Sn material.

* * * * *